United States Patent [19]

Ahn et al.

[11] 4,084,428
[45] Apr. 18, 1978

[54] TORQUE REACTION MOTOR PERFORMANCE EVALUATION

[75] Inventors: Byong-Ho Ahn, Wayland; Philip J. Gilinson, Jr., Chelmsford; Anthony Michael Moscaritolo, Saugus, all of Mass.

[73] Assignee: Charles Stark Draper Laboratory, Inc., Cambridge, Mass.

[21] Appl. No.: 796,151

[22] Filed: May 12, 1977

[51] Int. Cl.² ............................................ G01M 15/00
[52] U.S. Cl. ................................. 73/117.3; 73/133 R
[58] Field of Search .................... 73/116, 133 R, 117.3

[56] References Cited

U.S. PATENT DOCUMENTS

| | | | |
|---|---|---|---|
| 2,724,801 | 11/1955 | Oster | 73/116 X |
| 3,898,875 | 8/1975 | Knoop et al. | 73/116 |

*Primary Examiner*—Jerry W. Myracle
*Attorney, Agent, or Firm*—Weingarten, Maxham & Schurgin

[57] ABSTRACT

A torque reaction test system for evaluating the performance characteristics of a test motor by detecting its inertial reaction torque to acceleration and deceleration of the rotor. In one embodiment a test motor, typically at a final assembly stage and contained within a housing where it is inaccessible, is mounted in a rotatable fixture and the torque reaction of the test motor when accelerated and decelerated is obtained. The torque reaction is plotted against time or speed. A torque balance loop provides a feedback current which maintains the test motor housing within the fixture at a predetermined point of rotation and which provides an indication of torque reaction. A further embodiment provides a dynamometer in which a test motor is driven by a drive motor for a rapid run-up time and the torque response characteristics are plotted as a function of time or speed to provide nondestructive determination of system parameters.

29 Claims, 10 Drawing Figures

TORQUE REACTION MOTOR PERFORMANCE EVALUATION

FIELD OF THE INVENTION

The present invention relates to nonintrusive testing of motors.

BACKGROUND OF THE INVENTION

In the testing of precision motors such as those typically found in gyroscope applications, the motor is typically fabricated to include a central stator and circumferential rotor contained within a float housing which is in turn floated within a damping fluid and rotationally supported therein within a further, encasing housing. When assembled at the float level, gyroscope level, or system level, the motor and its rotor are inaccessible for testing purposes, while at the unassembled stage, the motor is unprotected by the thermal absorption of the assembly and is readily damaged by being accelerated to operating speed in this unprotected environment.

SUMMARY OF THE INVENTION

The present invention provides a system for measuring performance characteristics of a motor, typically a high precision motor, in conjunction with support bearings for the rotor in a nonintrusive manner by detecting the torque reaction generated by acceleration and deceleration of the motor rotor. In a first embodiment of the invention, the test motor is driven in a dynamometer fashion by a drive motor and the torque reaction of the excited test motor is detected by suspending the test motor in a rotatable fixture, typically supported in low friction air bearings. A signal is developed corresponding to the rotation of the support fixture in response to the reaction torque of accelerating and decelerating the rotor and this signal is applied through a torque balance loop to restrain the rotation of the test motor fixture through a torque generator. A tachometer detects the speed of the drive motor and this, in conjunction with measured test motor excitation current and the torque restraint signal is employed to plot a set of curves which indicate a plurality of motor performance characteristics.

In a second embodiment of the invention, the completed gyroscope including the motor mounted within the float housing and fluid suspension, as well as the outer casing housing, is mounted for rotation within the test fixture controlled by the torque balance restraint loop. The torque signal is then employed to provide an output indication of a plurality of performance characteristics. In particular a persistent oscilloscope plot is provided of torque versus torque integral (employed to provide a speed indication), all completely nonintrusive of the housing for the motor. Torque and torque integral signals can be applied to a digital sample-data processing system for further computation and graphic display.

DESCRIPTION OF THE DRAWING

These and other features of the present invention are more fully set forth in the following detailed description and the accompanying drawing, of which.

DETAILED DESCRIPTION OF THE INVENTION

The present invention contemplates a system for nonintrusive and nondestructive motor evaluation, particularly adapted for use in performance and precision motors of the type found in gyroscopes for inertial navigation. The present invention operates by detecting the reaction torque of the motor during acceleraton and deceleraton when the motor is rotationally supported about is spin axis.

Figure 1:
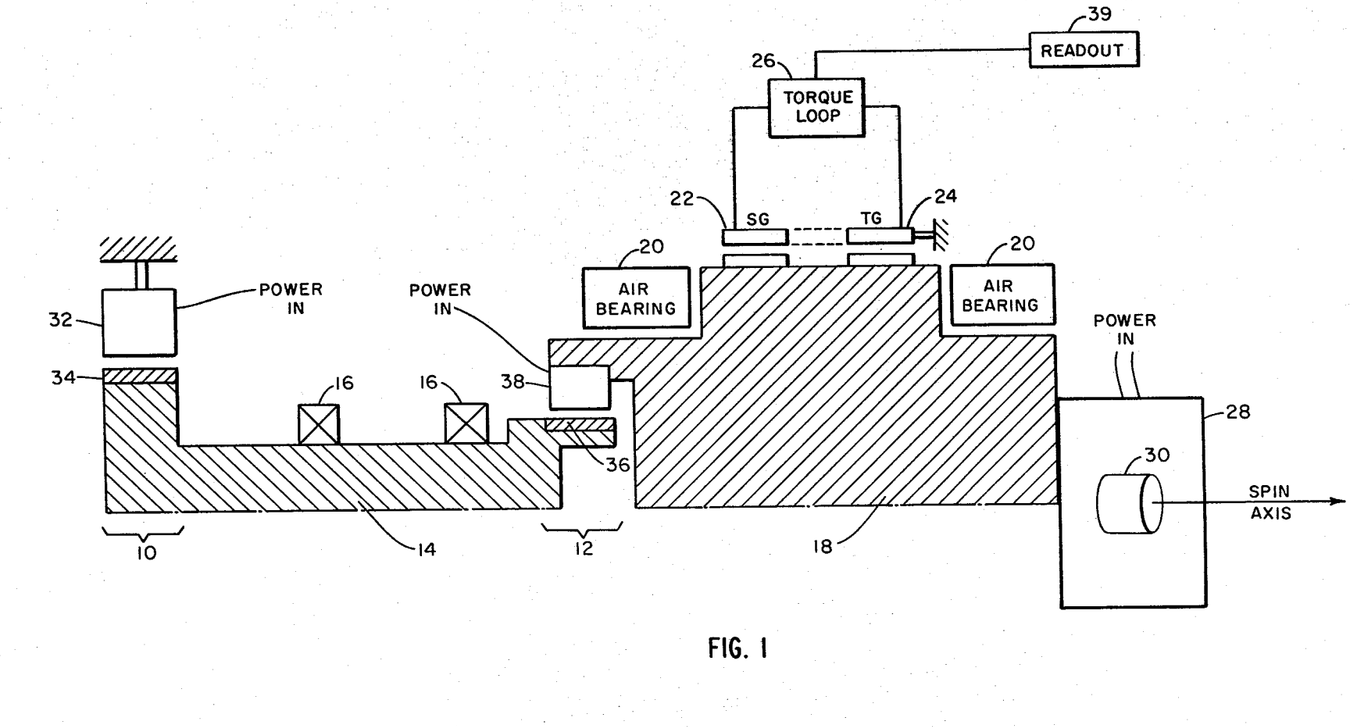
FIG. 1 is a schematic representaton of a motor system in a torque reaction measurement and restrain fixture useful in explaining the principle of operation of the present invention.

Such a function may best be illustrated by reference to FIG. 1 showing a one-half shaft rendering of a drive motor 10, test motor 12 coupled to a shaft 18, supported in air bearings 20. Shaft 18 has a signal generator 22 which detects rotation of shaft 18, which rotation may be restrained by a torque generator 24 acting through a torque loop 26 in response to the output of the signal generator 22. On the end of shaft 18, a gyroscope 28 having a rotor 30 is positioned with the rotor 30 spin axis parallel to the shaft 18 axis.

In one particular mode for the present invention, the drive motor 10 has its stator 32 excited, causing rotation of its rotor 34 and shaft 14. The shaft 14 is coupled to a rotor 36 of test motor 12. When a stator 38 of motor 12 is excited it tends to rotate with the rotor 36, torquing shaft 18 and producing a signal output at the signal generator 22 that results in a restraint current from loop 26 electronics that restrains shaft 18 against rotation. A signal representing the magnitude of the restraint is provided by loop 26 electronics to a readout system 39 to provide an indication of motor 12 performance.

In a second mode, the rotor 30 of gyro housing 28 is excited without excitation of motors 10 and 12. The result of rotor 30 acceleration is an oppositely directed torque on shaft 18. This torque is detected by the signal generator 22 and restrained by torque generator 24 resulting in an output to the readout system 39 representative of gyro motor performance.

Figure 2:
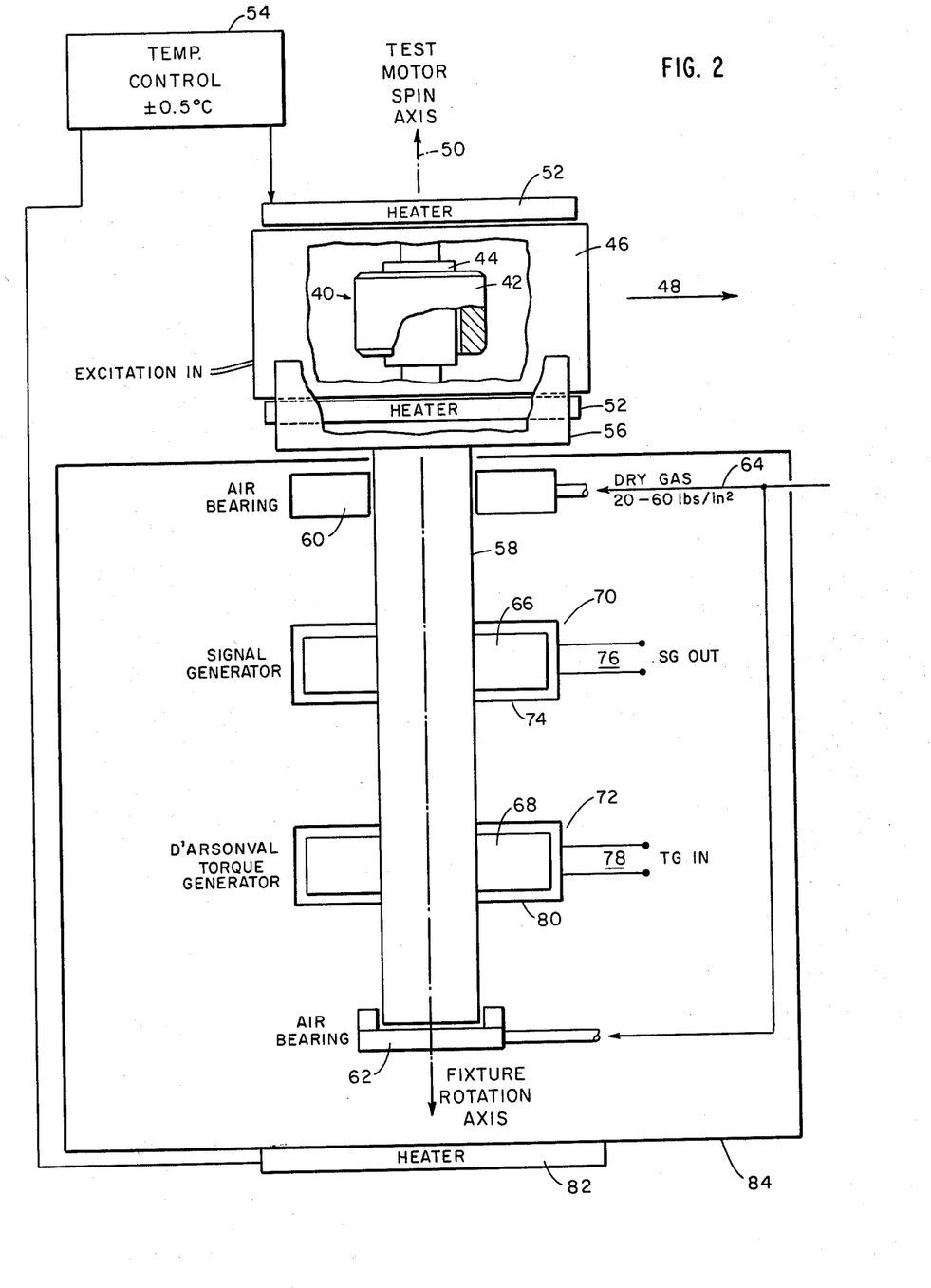
FIG. 2 is a structural diagram of an assembled gyroscope motor and rotational support fixture for use in the present invention.

With the general overview of the torque reaction measurement concept presented above, specifics of the present invention may now be described and in particular with reference to FIG. 2 there is shown a motor 40, typical of small motors employed in gyroscope construction, having an outer peripheral rotor 42 surrounding a stator 44. The stator 44 is typically secured inside a cylindrical float, not shown, which is floated at close to neutral buoyancy within a gyroscope housing 46 for rotation about a float axis 48, orthogonal to a motor spin axis 50. Preferably, the entire assembly of motor, float and housing are temperature controlled by heaters 52 placed about the casing 46 and energized by a temperature controller 54.

The gyroscope outer casing 46 is supported within a cradle 56 on a shaft 58 which is rotatable within air bearings 60 and 62 using known technology. The air bearings 60 and 62 are pressurized with a dry gas at, for example, 20–60 pounds per square inch, through a supply line 64.

The shaft 58 has placed around it rotors 66 and 68 of a respective signal generator 70 and torque generator 72. A rotation indicating signal is provided from the stator 74 of the signal generator 70 on output lines 76. A torque current is applied to the shaft 58 through a pair of signal lines 78 applied to a stator 80 of the torque generator 72. Electronics, described below, function is response to the signal from the signal generator output on line 76 to provide a restorative torque signal on the torque generator lines 78 to maintain the rotational position of the shaft 58 and of the gyroscope casing 46 at a predetermined location as is known in the art. The tendency to rotate one way or the other out of this predetermined rotational position is a result of acceleration or deceleration of the rotor wheel 42 of the gyroscope motor 40 as was explained above in accordance with FIG. 1.

The temperature controller 54 may also be employed to maintain the temperature of the air bearing, signal generator and torque generator elements through a heater 82 placed upon an enclosure 84 for the rotational mounting elements and signal and torque generators.

Figure 3:
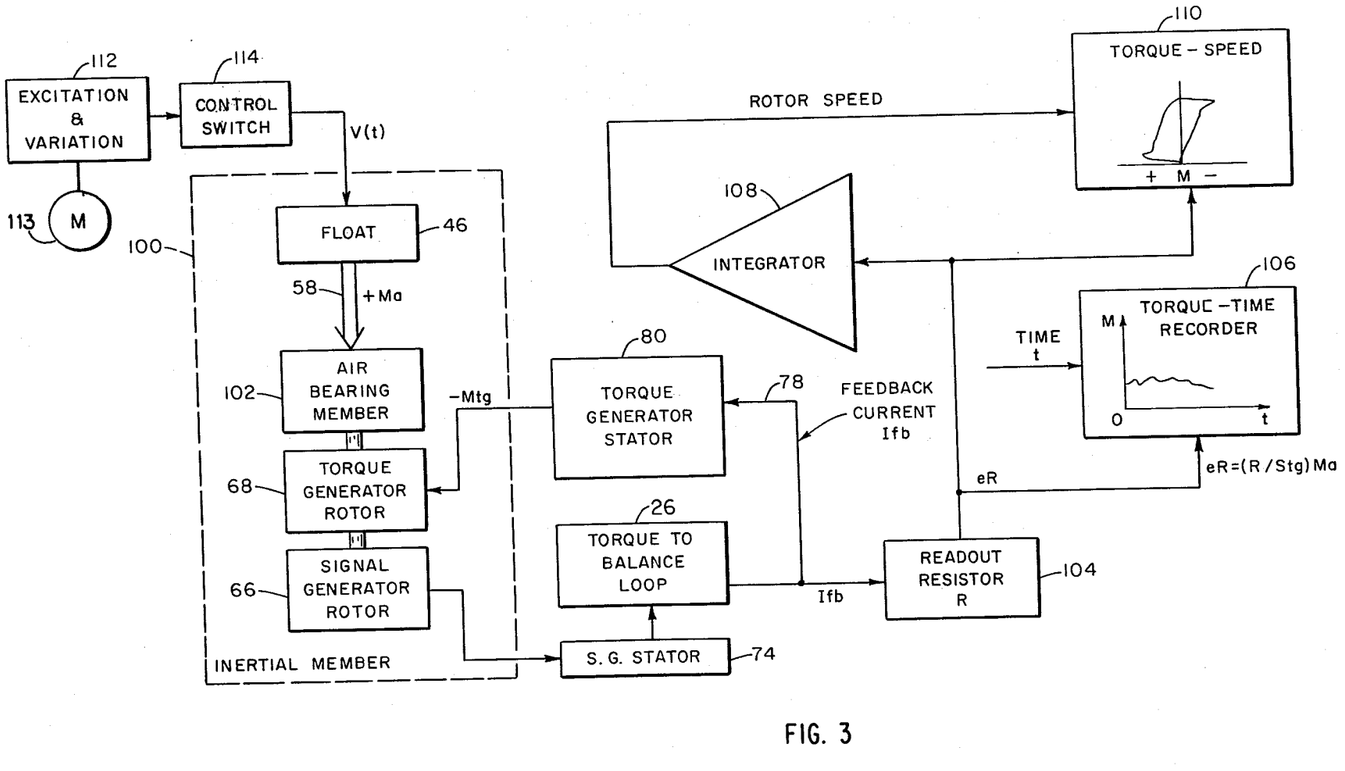
FIG. 3 is a block diagram of a first embodiment of the invention typically for use in float level measurement systems.

With respect now to FIG. 3, the detailed electronics operative in response to the signal generator output to provide a torque generator input and to provide indicia of motor performance characteristics is more fully illustrated. In FIG. 3, an inertial member 100 is shown to represent the entire rotationally supported mass including the gyroscope, float and casing 46, shaft 58, air bearing system represented schematically by an air bearing member 102 and the signal generator rotor 66 and torque generator rotor 68. Only the magnetic field lines between the torque generator rotor 68 and stator 80 and signal generator rotor 66 and stator 74 cross the barrier between the rotating mass and the fixture within the enclosure 84 of FIG. 2. The signal generator output, representing the direction and magnitude of rotation is applied within the torque to balance loop.

The output of the torque to balance loop 26, typically identified as a current Ifb or a restraint torque feedback current is returned to the torque generator stator 80 to produce a torque on the rotor 68 that restores the float and shaft position to essentially the null position of the signal generator 66, with only a sufficiently small signal output to maintain the current at that point. Using known feedback techniques, the loop gain can be adjusted to the point where the actual displacement is negligible. But because the mass of the floating element and response time of the loop electronics produce a finite response time in the total loop, there will be a damped response, either over-damped or under-damped depending upon loop characteristics. Thus a small, actual rotatonal displacement of the shaft will occur in response to an impulse torque, such as at motor turn-on, until the loop can respond and settle. The effect of this upon system measurement output is discussed more fully below.

The torque restraint current feedback signal is then used for providing an indication of system performance characteristics, preferably by conversion to a directly corresponding voltage in a readout resistor 104. The voltage signal from a resistor 104, R, is a direct indication of reaction torque for motor aceleration or deceleration transmitted through the shaft 58 multiplied by the constants reflecting the signal generator characteristics and the value of the resistor 104. This signal may be applied to the Y control of a torque-time recorder 106, time being applied as an X input. In accordance with the present invention, however, it is preferable to provide for a measurement of torque versus speed characteristics by applying the output from the resistor 104 through an integrator 108 whose output may be used to represent rotational rate of motor rotor 42 and applied as a Y control to an XY recorder 110. The output of the resistor 104 is then applied as an X input to the recorder 110 in order to provide a torque versus speed trace. In view of the desire for rapid response characteristics in the XY recorder 110, it is preferable that it be a persistence ocsilliscope, one in which the cathode ray tube trace persists for a number of minutes or more after the initial trace of the electron beam across the phosphor surface. Other high rate, persistent trace recorders may be used where available or desired. The persistent trace may be photographed for a longer record. A data acquisition system may additionally be employed to provide data sampling and analysis of the informaton in the signals applied to the recorder 110.

To produce the trace on the XY recorder 110, excitaton is applied to the test motor from an excitation source 112 which is preferably adapted to provide excitation at variable amplitude or power levels through a control switch 114 which permits control over the moment of application and removal of excitation to the motor within the inertial member 100.

Figure 6:
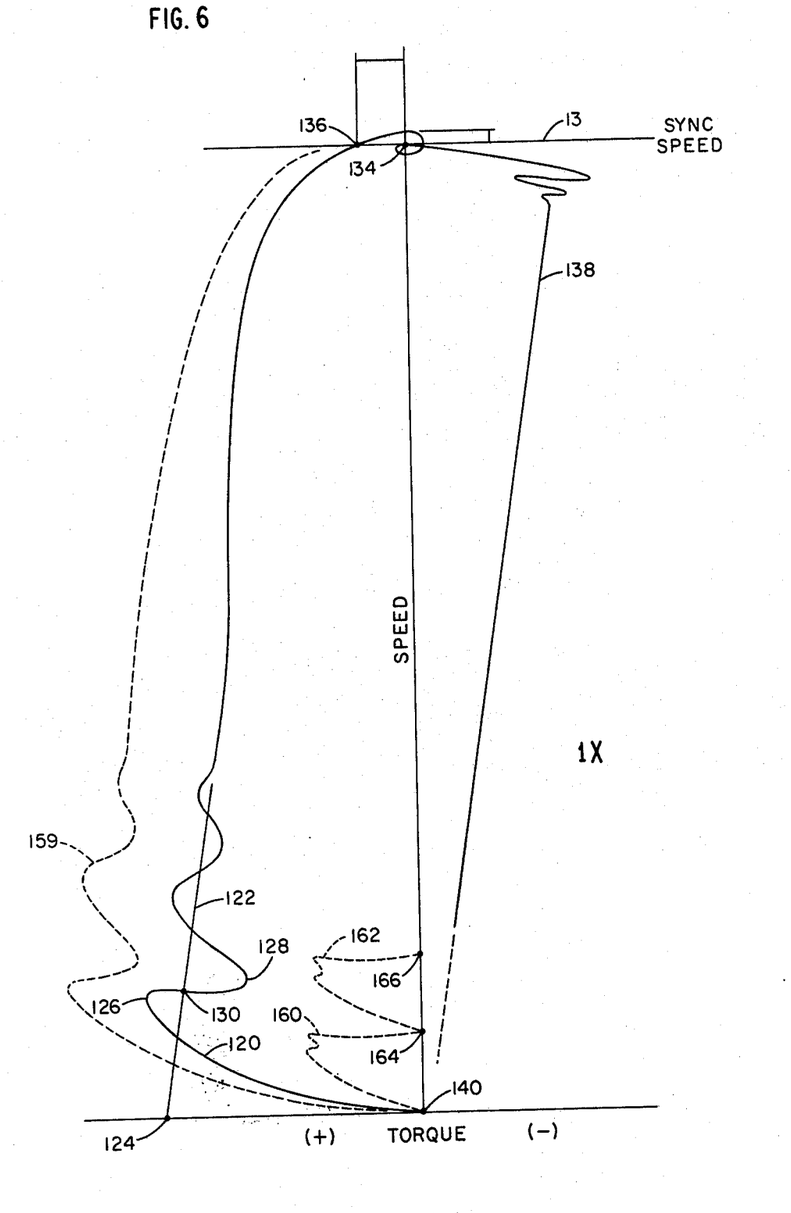
FIGS. 6-10 are diagrams of persistent trace recordings of specific output information provided by the present invention.

The trace thus made available upon the recorder 110 provides a great deal of independently available information about the motor characteristics. This information is best understood by reference to exemplary trace diagrams presented in FIG. 6–10. With particular reference to Fig. 6, there is shown a typical acceleraton, left-hand trace, and deceleration, right-hand trace, torque versus speed curve produced in accordance with the present invention by recorder 110 or a data acquisition system. At the moment of turn-on, a torque is applied to the rotor 42 which produces a reacton torque about the shaft 58 indicated by the curve 120 in FIG. 6. Because of the finite response time of the torque to balance loop referenced above, the actual value in terms of torque along the X axis of the curve 120 will build slowly, typically oscillating about a true torque curve 122 in an under-damped characteristic as the rotor accelerates. The actual torque curve 122 may be measured using known graphical or data processing techniques and its extension to the axis determines a point 124, whose distance from the zero torque point measures the locked torque of the rotor, the frictional static torque which must be overcome to commence rotor motion.

A typical technique for determining the curve 122 involves the following steps which may be performed manually, or by automated machine processing as is known in the art. The process involves determination of the points upon the curve 120 at which the curve 122 crosses. This is in one exemplary case determined by the midway point along the speed axis between peaks 126 and 128 to determine the crossing point 130 between the two respective peaks. Subsequent crossing points may be determined in a similar manner and the curve 122 may be readily plotted based upon the assumption that the distance between each peak at a crossing point should be a constant $\pi/2$ radians at the period of curve 120. The locked torque parameter thus determined is a valuable indication of motor performance characteristic.

The curve 120, for a motor excited sufficiently to obtain synchronous speed in the case of a synchronous motor, will accelerate to a synchronous speed level 132, passing through a slight oscillation degenerating to the point 134 at zero torque and at synchronous speed. The torque indicated by the curve 120 at the point 136 where synchronous speed is first achieved is termed a synchronous torque margin and is indicated by the torque distance between the points 134 of final settlement of the curve at synchronous operating speed and the original corssing point.

At the point where excitation is removed from the test motor, the wheel will immediately begin to decelerate in accordance with the deceleration curve 138, the torque there being representative of frictional and magnetic drag effects resulting from windage, bearing friction and rotor magnetization as explained more fully below.

Figure 7:
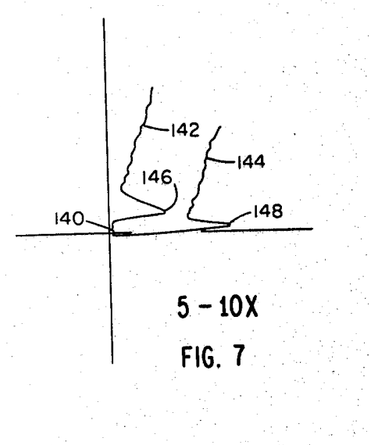

As the deceleraton curve 138 approaches the rotor stopped, zero torque point 140 at which the rotor stops moving a number of factors can be detected by an expanded scale presentation of the region around the point 140 as, for example, shown in FIG. 7. As shown there, two rundown traces 142 and 144 represent respectively rundown curves at conditions of rotor demagnetizaton and magnetizaton respectively. In the case of magnetization, it is clear that the torque reaction remains above a line aimed toward the idle point 140. At the same time, the traces represented in FIG. 7 show torque peaks 146 and 148 respectively indicating, in this case of a fluid bearing, the points at which bearing touchdown occurs, i.e. air or fluid suspension of the bearing is lost. The view in FIG. 7 is typically expanded five to 10 times over that of the view in FIG. 6, and is typically expanded greater along the Y axis.

Figure 8:
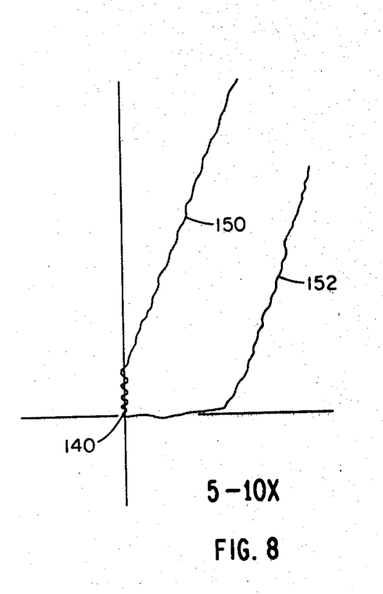
Figure 9:
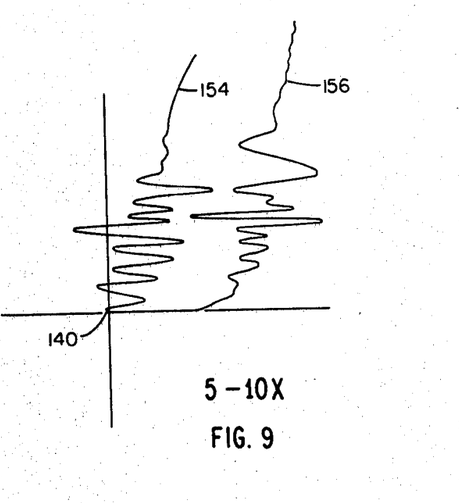
Figure 10:
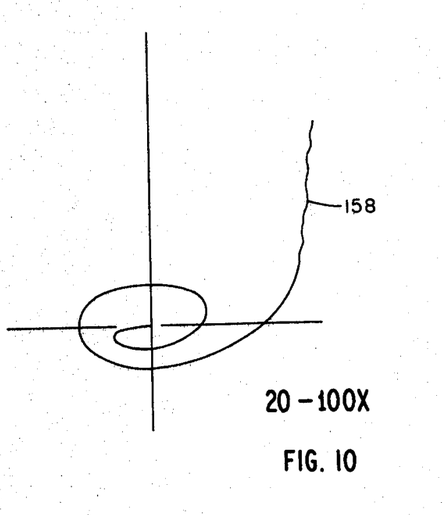

In FIG. 8, rundown curves 150 and 152 for demagnetized and magnetized rotors are shown without the torque spike indicative of a fluid support bearing but indicating a relatively good quality bearing with a smooth deceleration to the stopped point 140 as opposed to the deceleration illustrated in FIG. 9. In FIG. 9, on a similar scale, rundown curves 154 and 156 show extreme torque variations near the stop point 140 indicative of a deflective bearing. On a yet more expanded scale in FIG. 10 a rundown characteristic curve 158 is shown for a magnetized rotor decay characteristic in which the torque oscillates about the zero torque position down to an extremely low level indicating no actual bearing touchdown or loss of suspension until actual cessaton of motion.

It is possible to detect other characteristics of the motor using the above system in conjunction with the display output of the type represented in FIG. 6. In particular, by varying the voltage of the variable excitation source 112, it is possible to detect the voltage required to start the motor rotating at the point when the trace of FIG. 6 first commences to show a torque versus speed characteristic of the type of curve 120. At higher voltages, a family of additional curves such as curve 159 are generated. The lowest of these curves provides the lowest voltage for synchronous operation. At low voltage, and in particular with poor bearings or high rotor friction, the voltage required to just start the motor may produce a series of curves such as 160, 162, etc. shown in FIG. 6 representing successively applied voltage increments in the motor excitation, each producing an acceleration and torque characteristic but with the motor failing to accelerate to full synchronous. speed or settling out to corresponding rotational speeds 164 and 166, etc. for that applied voltage. By successive voltage increments, it is then possible to determine with a curve of the type in FIG. 6 the actual voltage required to achieve synchronous running speed of the motor from meter 113.

By timing the interval from the initial time of excitation to the actual settlement of the rotor at synchronous speed, and in particular the various points such as points 134 and 136 and the curve characteristics achieved in settling in or pulling in to synchronous speed, additional performance characteristics of the motor are revealed.

Also in the case of faulty or dirty, debris contaminated bearings, the traces of FIG. 6 may be supplemented by wild excursions in torque of the acceleration curve 120.

Finally, total acceleration and decleration power may be determined as the sum of the acceleration and deceleration powers reflected in the curves of FIG. 6. In particular, the acceleration power is equal to the integral over the speed axis of the torque on the acceleration or left-hand side, while the deceleration power (a negative power) is similarly equal to the integral from synchronous speed to the stop speed of the deceleration torque reflected in the left-hand side of the curve. These power indications may be determined by data processor instrumentation or by graphical solution techniques.

Figure 4:
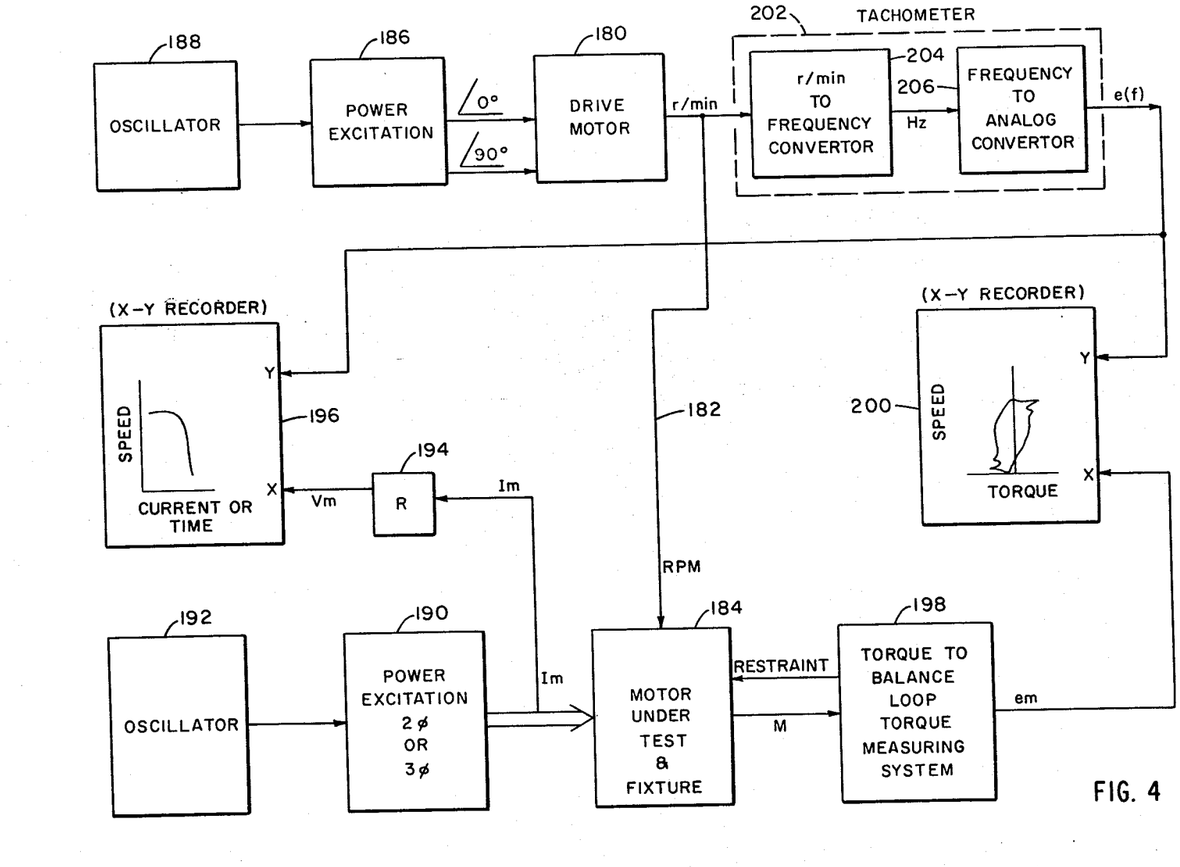
FIG. 4 is a block diagram of the electronics associated with a further embodiment of the invention.

With respect to a further embodiment of the invention as presented in FIG. 4, a dynamometer torque reacton motor test system is presented in which a drive motor 180 is connected by a low friction, high bearing quality shaft 182 to a motor 184 under test. The drive motor, typically a two-phase motor, is excited from a power amplifier 186 controlled by an oscillator 188. The test motor 184 is driven by the output of a power amplifier 190 which is typically a multiple phase supply for a synchronous test motor and which is controlled by an oscillator 192. The magnitude of the current applied to the test motor 184 is converted to a voltage in a resistance 194 and applied to the input of an XY recorder 196. The motors 180 and 184 are mounted as indicated above in FIG. 1 to provide for a torque reaction during motor acceleraton. A signal representative of the balance torque current which is applied to restrain motion of the rotatonal support fixture by a torque to balance loop 198 is applied as an X input of a speed-torque recorder 200.

A tachometer 202 is provided to detect the rotatonal speed of the shaft 182 and includes a converter 204 for conversion of rotaton of shaft 182 to frequency and a converter 206 for frequency to amplitude conversion. The amplitude output is applied to the Y sheed axis of the recorder 200, as well as the recorder 196.

The system of FIG. 4 is typically operated in the context of a test motor 184 which has been unassembled into its final housing which, in the case of a typical gyroscope installation permits a great deal of heat dissipation that would otherwise damage the motor. Accordingly, excitaton of the motor 184 directly in run-up under its own power would produce a substantial thermal overload. To avoid this, the drive motor 180 is provided to run the motor 184 to synchronous speed under operating conditions of self excitation, far more rapidly than it would be able to do itself. The configuration of FIG. 4 thus permits generation of a speed torque trace for a bare motor to provide the data indicated above far more economically and rapidly and without risk of motor damage.

Figure 5:
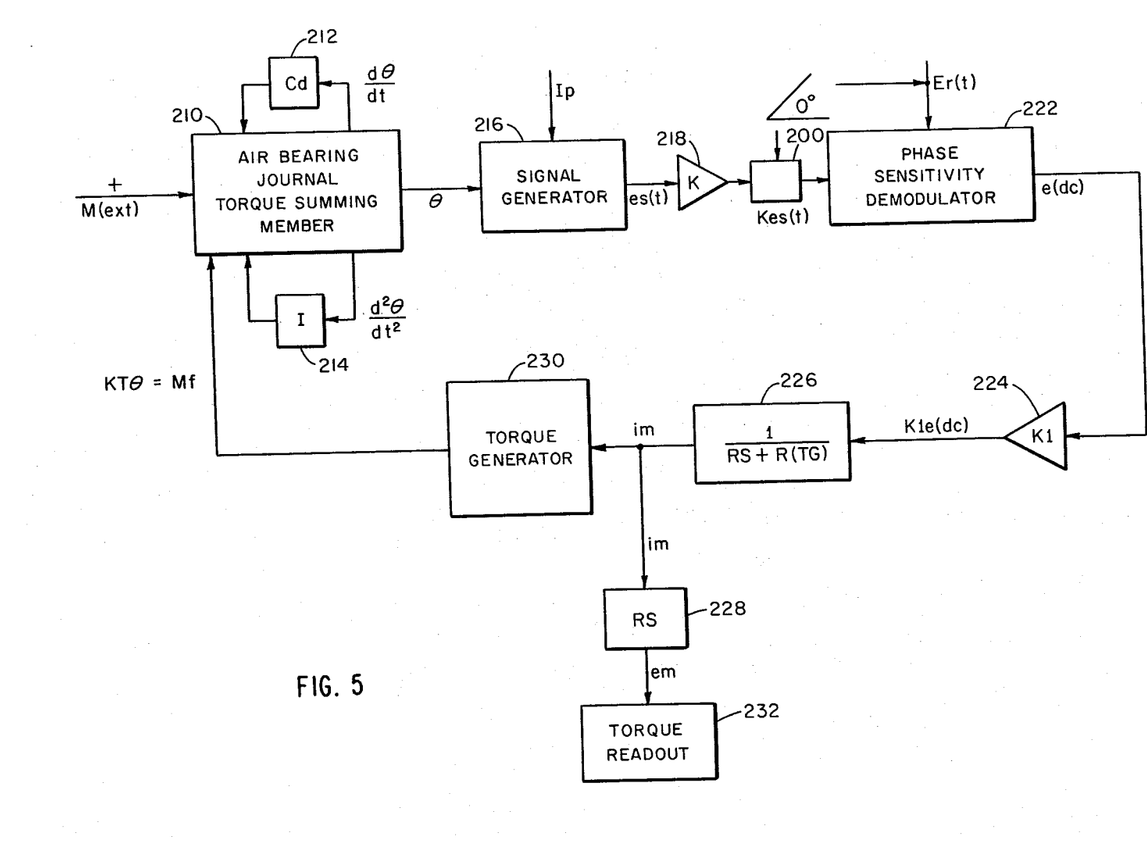
FIG. 5 is a block diagram of further aspects of the FIG. 2 embodiment.

Turning to FIG. 5, there is shown a typical torque-to-balance loop for use within the present invention. As illustrated there, a torque summing amplifier 210 is shown to reflect and represent the rotatonally supported motor and associated components, which acts in the loop equaton as the summing member for the torque and feedback effects. Characteristics of the torque summing member which are accounted for in the loop include a feedback constant, Cd, which is a damping coefficient element 212 of the suspended mass, a feedback constant I, as well as an inertial element 214.

The angular displacement signal (signal generator output) is supplied to a signal generator 261 (variable amplifier) for scaling by a primary current Ip to produce a secondary output voltage $es(t)$ which is applied through an amplifier 218 of gain K. A phase shifter 220 adjusts the phase of the signal from amplifier 218 before application to a phase-sensitive demodulator 222 to produce a maximized DC output signal directly representative of angular displacement. This is further amplified by a factor Kl in an amplifier 224 and then applied through a voltage-to-current coverter having tansfer characteristics /(Rs+Rtg) which respectively reflect the value of a sampling resistor 228 and the torque generator winding resistance of a torque generator 230 to convert the current signal to a voltage. zZ The torque generator 230 responds to the current signal from the voltage to current conversion filter 226 to provide a torque proportional to the angle of deflecton from the zero signal of the signal generators. The gains K and Kl can be adjusted such that the actual value of the deflection can be kept negligibly small under equilibrium conditions. Its value is considered infinitesimal in terms of actual displacement although the signal applied t the torque generator 230 is of a value accurately representing the reaction torque.

The output of the conversion resistor 228, a voltage, is applied to torque readout elements 232 as indicated above to provide the corresponding signals.

The above-described system is intended as exemplary only, alternatives being intended to fall within the scope of the invention. Accordingly, the invention is to be limited only in accordance with the following claims.

What is claimed is:

1. A process for analyzing the motor characteristics of an electrical motor mounted within and energizable through a housing which is mounted in a rotation mount for rotation about an axis other than orthogonal to the motor spin axis, said process comprising the steps of:
  applying an energization signal to said motor to produce rotation of the rotor thereof about its spin axis;
  sensing rotation of said housing from a predetermined position with respect to said mounting to provide a rotation signal;
  generating a restraint signal representative of said rotation signal;
  restraining the rotation of said housing in response to said restraint signal against rotation from a predetermined position;
  providing a signal representative of motor speed;
  providing an indication of a plurality of motor performance characteristics in response to said restraint signal and said speed representing signal.

2. The process of claim 1 wherein said step of providing an indication of a plurality of motor performance characteristics include the step of providing an indication of run-up time in the case where said motor is a synchronous motor.

3. The process of claim 1 wherein said step of providing an indication of a plurality of motor performance characteristics includes the step of providing an indication of motor rundown characteristics including an indication of the point of bearing contact for the motor rotor bearings.

4. The process of claim 1 wherein said step of providing an indication of a plurality of motor performance characteristics includes providing an indication of motor rotor bearing condition.

5. The process of cliam 4 wherein said step of providing an indication of motor bearing condition includes the step of providing an indication of bearing debris contamination.

6. The process of claim 1 wherein said step of providing an indication of a plurality of motor characteristics includes the step of providing an indication of motor start-up voltage.

7. The process of claim 1 wherein said step of providing an indication of a plurality of motor performance characteristics includes the step of providing an indication of the voltage necessary to produce synchronous operation of said motor rotor in the case where said motor is a synchronous motor.

8. The process of claim 1 wherein said step of providing an indication of a plurality of motor performance characteristics includes the step of providing an indication of motor locked torque as an indication of the frictional torque which must be overcome to commence rotation of the motor rotor.

9. The process of claim 1 wherein said step of providing an indication of a plurality of motor performance characteristics includes the step of providing an indication of rotor magnetization.

10. The process of claim 1 wherein said step of providing an indication of a plurality of motor performance characteristics includes providing said indication in a single output format.

11. The process of claim 10 wherein said indication providing step includes the step of producing a graphic trace of said speed representing signal against said restraint signal.

12. The process of claim 1 further including the step of maintaining a controlled temperature for said housing and motor therewithin.

13. The process of claim 1 further including the step of providing a controlled temperature for said rotation mount.

14. The process of claim 1 wherein said step of providing an indication of motor speed includes the steps of:
  responding to said excitation signal to provide conversion thereof to a signal of a corresponding frequency; and
  responding to said signal of a corresponding frequency to provide conversion thereof to a signal of a predetermined amplitude corresponding to said frequency.

15. The process of claim 1 wherein said step of providing an indication of a plurality of motor performance characteristics includes the step of providing a visable indication of motor speed versus reaction torque transmitted to said rotation mount means with persistent characteristics on a luminous screen.

16. The process of claim 1 wherein said step of providing an indicaton of a plurality of motor performance characteristics includes the step of providing a visible trace of persistent characteristic of motor speed versus said exictaton signal.

17. The process of claim 1 wherein said step of providing an indicaton includes the step of providing a visible trace of the magnitude of said restraint signal against the magnitude of the inergral of said restraint signal.

18. The process of claim 1 wherein said step of providing an indication includes the step of providing an indication of the magnitude of said restraint signal as a function of motor speed.

19. The process of claim 1 wherein said step of providing excitation to said motor includes the step of providing excitation over a time interval sufficient for said motor to reach maximum speed under that excitation.

20. The process of claim 19 further including the step of providing excitation repeatedly over said interval at successively different levels of excitation.

21. The process of claim 1 further including the step of providing said indicaton at a plurality of different levels of applied energization signal.

22. A system for providing an indication of performance characteristics of a motor within a housing comprising:
- means for exciting said motor from rest to speed to rest, defining an energizaton cycle;
- means for rotationally mounting said housing to provide rotation thereof about an axis which is other than orthogonal to the spin axis of said motor;
- means for detecting rotaton of said housing with respect to said mounting means to provide a rotation signal;
- means responsive to said rotation signal for developing a feedback torque signal;
- means for torquing said mounting means to restrain the rotation of said housing in response to said torque signal;
- means responsive to said torque signal to provide an output indicaton of a plurality of motor performance characteristics from a single energization cycle.

23. The system of claim 22 wherein said means for providing an output indication of a plurality of motor performance torque characteristics includes means for providing a persistent trace of a signal representative of said feedback torque signal as a function of the integra;l thereof.

24. The system of claim 22 wherein said motor includes a central stator and peripheral gyroscope rotor.

25. The system of claim 24 wherein said motor includes a gyroscope motor in said housing having therein a fluid supported second housing containing said motor and rotatable about an axis substantially orthogonal to the spin axis of said motor.

26. The system of claim 25 wherein said housing includes an inertial system of plural gyroscope motors and associated housings.

27. A dynamometer system for measuring the performance characteristics of a test motor comprising;
- a test motor having a rotor and a stator;
- means for exciting said test motor stator;
- a drive motor having a rotor;
- means for exciting said drive motor to cause rotation of said drive motor rotor;
- means for coupling said drive motor rotor to said test rotors motor whereby the rotors of each motor are coupled for co-rotation;
- means for rotationally mounting said test motor stator about an axis which is other than orthogonal to the spin axis of said test motor rotor;
- means for detecting rotation of said stator of said test motor within said mounting means;
- means for developing a restraint signal responsive to the detected rotation of said stator;
- means for restraining rotation of said stator within said mounting means in response to said restraint signal;
- means for providing a representation of motor performance characteristics in response to at least the detected rotation of said test motor stator.

28. The system of claim 26 wherein said means for providing an indication includes means for detecting the rotaton speed of said test motor rotor for providing an indication of motor performance characteristics as a function of test motor rotor speed.

29. The system of claim 26 wherein said drive motor has, in response to the excitaton therefor, a substantially more rapid run-up time than the run-up time of said test motor in response to the excitation applied thereto.

* * * * *

UNITED STATES PATENT AND TRADEMARK OFFICE
CERTIFICATE OF CORRECTION

PATENT NO. : 4,084,428                                     Page 1 of 3
DATED : April 18, 1978
INVENTOR(S) : Byong-Ho Ahn et al It is certified that error appears in the above—identified patent and that said Letters Patent is hereby corrected as shown below:

Column 1, line 65, "representaton" should read --representation--;
Column 2, line 22, "acceleraton" should read --acceleration--;
           line 23, "deceleraton" should read --deceleration--;
Column 3, line 13, "line" should read --lines--;
           line 57, "rotatonal" should read --rotational--;
           line 67, "aceleration" should read --acceleration--;
Column 4, line 36, "FIG." should read --FIGS.--;
           line 37, "acceleraton," should read --acceleration,--;
           line 42, "reacton" should read --reaction--;
Column 5, line 13, "corssing" should read --crossing--;
           line 21, "deceleraton" should read --deceleration--;
           line 32, "this" should read --the--;
           line 52, "cessaton" should read --cessation--;
Column 6, line 32, "reacton" should read --reaction--;
           line 45, "acceleraton" should read --acceleration--;

UNITED STATES PATENT AND TRADEMARK OFFICE
CERTIFICATE OF CORRECTION

PATENT NO. : 4,084,428
DATED : April 18, 1978
INVENTOR(S) : Byong-Ho Ahn et al

It is certified that error appears in the above—identified patent and that said Letters Patent is hereby corrected as shown below:

Column 6, line 47, "rotatonal" should read --rotational--;
            line 50, "rotatonal" should read --rotational--;
            line 52, "rotaton" should read --rotation--;
            line 54, "sheed" should read --speed--;
            line 61, "excitaton" should read --excitation--;
Column 7, line 6, "rotatonally" should read --rotationally--;
            line 8, "equaton" should read --equation--;
            line 24, "coverter" should read --converter--;
            line 24, "tansfer" should read --transfer--;
            line 25, "/(Rs+Rtg) should read --1/(Rs+Rtg)--;
            line 28, "zZ" should be deleted;
            lines 31-32, "deflecton" should read --deflection--;
            line 37, "applied t the" should read --applied to the--;
Column 8, line 14, "cliam" should read --claim--;

UNITED STATES PATENT AND TRADEMARK OFFICE
CERTIFICATE OF CORRECTION

PATENT NO. : 4,084,428
DATED : April 18, 1978
INVENTOR(S) : Byong-Ho Ahn et al

It is certified that error appears in the above—identified patent and that said Letters Patent is hereby corrected as shown below:

Column 9, line 5, "exictaton" should read --excitation--;
line 7, "indicaton" should read --indication--;
line 9, "inergral" should read --integral--;
line 24, "indicaton" should read --indication--;
line 30, "energizaton" should read --energization--;
line 34, "rotaton" should read --rotation--;
line 43, "indicaton" should read --indication--;
Column 10, line 3, "integra;l" should read --integral--; and
line 44, "excitaton" should read --excitation--.

Signed and Sealed this

Thirty-first Day of January 1984

[SEAL]

Attest:

GERALD J. MOSSINGHOFF

Attesting Officer      Commissioner of Patents and Trademarks